United States Patent [19]

Yano et al.

[11] 4,091,345

[45] May 23, 1978

[54] ELECTROMECHANICAL FILTER HAVING A WIDE TEMPERATURE RANGE

[75] Inventors: Takeshi Yano; Seiichiro Kanazawa; Takehiro Futami; Yasuyuki Ishiyama, all of Tokyo, Japan

[73] Assignee: Nippon Electric Company, Ltd., Tokyo, Japan

[21] Appl. No.: 717,824

[22] Filed: Aug. 26, 1976

[30] Foreign Application Priority Data

Aug. 28, 1975 Japan .................. 50-104739

[51] Int. Cl.² .............. H03H 9/04; H03H 9/26; H03H 7/38; H01L 41/10
[52] U.S. Cl. .................. 333/71; 333/32; 333/72
[58] Field of Search ............. 333/71, 72, 32, 30 M; 310/8.2, 8.3, 8.4, 8.5, 8.6, 8.9, 9.5, 314, 315, 316, 317, 318, 319

[56] References Cited

U.S. PATENT DOCUMENTS

| 2,859,416 | 11/1958 | Niederman | 333/32 X |
| 2,955,267 | 10/1960 | Mason | 333/71 |
| 3,792,382 | 2/1974 | Guenther | 333/72 |

OTHER PUBLICATIONS

"Reference Data For Radio Engineers" Fifth Edition Copyright 1968, Howard W. Sams & Co., Inc. New York; Title Page and pp. 5-22 to 5-23.
Hass – "Channeling Equipment Technology Using Electromechanical Filters" in Electrical Communication, vol. 48, Nos. 1 and 2, 1973; pp. 16–20.

Primary Examiner—Alfred E. Smith
Assistant Examiner—Marvin Nussbaum
Attorney, Agent, or Firm—Sughrue, Rothwell, Mion, Zinn and Macpeak

[57] ABSTRACT

An electromechanical filter comprises a mechanical resonator, a pair of electromechanical transducers mechanically coupled to each other with the resonator interposed, and a pair of external matching circuits electrically connected to the respective transducers. Each matching circuit comprises a coil and a temperature-compensation capacitor connected to form a resonance circuit with the equivalent parallel capacitance of the associated transducer included therein. Resonant frequencies of the respective resonance circuits are rendered different from the passband center frequency of the filter. Preferably, the first-order temperature coefficients of the resonant frequency and the equivalent inductance of each transducer are selected to be (1) both negative and (2) positive and negative as the resonant frequency of the associated resonance circuit is rendered (1) higher and (2) lower than the center frequency.

8 Claims, 6 Drawing Figures

ELECTROMECHANICAL FILTER HAVING A WIDE TEMPERATURE RANGE

BACKGROUND OF THE INVENTION

This invention relates to an electromechanical filter, and more particularly, to an electromechanical filter comprising an external matching circuit at each of the input and output ends.

An electromechanical filter comprises a mechanical resonator and a pair of electromechanical transducers mechanically coupled to each other with the resonator interposed. When the filter further comprises an additional mechanical resonator or resonators, all resonators are sequentially interposed between the transducers. As taught in a paper contributed to *Proc. 20th Electronic Component Conference* (May 1970) by Morio Onoe and Takeshi Yano, the latter being one of the present applicants, the filter may comprise an additional electromechanical transducer or transducers.

Although characterized by compactness and steep and stable filter characteristics, an electromechanical filter is defective in that undulations, usually called "ripples", grow intolerably large in the filter characteristics when a change occurs in the ambient temperature beyond a certain limit. The growth of ripples results from the fact that terminal impedances do not follow changes caused by the temperature change in equivalent inductances of the respective transducers and also from the fact that each of their resonant frequencies takes a value different from a predetermined resonant frequency due to the above temperature change. A change in the transducer resonant frequency is suppressed by achieving in each of the transducers a counterbalance between temperature coefficients of Young's moduli of a piezoelectric ceramic piece and an elastically invariant alloy piece made of iron, nickel, chromium and titanium attached to one or each of the ceramic piece faces. The temperature change of the equivalent inductances depends mostly on the temperature coefficient of dielectric constant of the piezoelectric ceramic material.

Although attempts have been made to reduce the temperature dependency by minimizing the temperature coefficient of the dielectric constant, the results have indicated that the minimum dependency achieved amounts to about ± 10% for a temperature change of 40° C and that a limit is inevitably imposed on improvement of the temperature characteristics of an electromechanical filter. Another approach to the temperature characteristics improvement is disclosed in an article contributed by Toshio Ashida to a Japanese technical periodical, *Densi Tusin Gakkai Ronbunsyu* (*The Transactions of the Institute of Electronics and Communication Engineers of Japan*), Vol. 57-A, pp. 345-352 (No. 5) entitled "Ondo-tokusei o koryosita kikai-hwiruta-yo Atuden-henkansi no Sekkei" or "Design of Piezoelectric Transducers for a Temperature-Stable Mechanical Filter". In the Ashida article, relations are derived between the temperature dependency of filter characteristics and changes in the parallel capacitance, capacitance ratio, and resonant frequency of the electromechanical transducer in both cases where the filter is accompanied and not accompanied by a pair of external coils. The article thus provides an electromechanical filter wherein a counterbalance is reached between the temperature dependency and the temperature changes. On the other hand, it is conventional to make an electromechanical filter comprise a pair of external matching circuits, each comprising a coil as in the Ashida article and a temperature-compensation capacitor. In any event, a temperature range in which an electromechanical filter is operable with a one-twentieth C.C.I.T.T. standard (one-twentieth of the characteristics defined in International Telephone and Telegraph Consultive Committee Recommendation G-132) satisfied has been very narrow, being restricted to 4° C–43° C. Incidentally, the matching circuits are called external because they, although included in an electromechanical filter in a sense, are external to that combination of the transducers and resonator or resonators which serves by itself as an electromechanical filter.

SUMMARY OF THE INVENTION

It is therefore an object of the present invention to provide an electromechanical filter stably operable in a wide temperature range.

It is another object of this invention to provide an electromechanical filter which satisfies the one-twentieth C.C.I.T.T. standard even at as high a temperature as 60° C.

It is still another object of this invention to provide an electromechanical filter that satisfies the one-twentieth C.C.I.T.T. standard in a wide temperature range amounting nearly to 100° C.

An electromechanical filter to which this invention is applicable comprises a mechanical resonator, an input electromechanical transducer for converting electric energy to mechanical energy, an output transducer for converting mechanical energy to electric energy, and a pair of external matching circuits electrically connected to the respective transducers. The transducers are mechanically coupled to each other with the resonator interposed. The filter is provided with a predetermined passband that includes a center frequency of the passband. Each of the transducers has an equivalent inductance, an equivalent parallel capacitance, and an equivalent series capacitance. Each matching circuit comprises a coil or inductor and a temperature-compensation capacitor connected to form a resonance circuit together with the parallel capacitance of the electrically connected transducer. In accordance with this invention, circuit resonance frequencies of the respective resonance circuits are rendered different from the center frequency.

In connection with this invention, it may be mentioned here that both the coil and capacitor may be connected in parallel to the associated transducer, that the coil may be in parallel while the capacitor is connected in series on either side of the coil with respect to the relevant transducer, or that both the coil and capacitor may be in series. In addition, it should be pointed out that the circuit resonant frequencies are rendered equal to the center frequency in a conventional electromechanical filter of the like structure.

DESCRIPTION OF THE PREFERRED EMBODIMENTS

Figure 1:
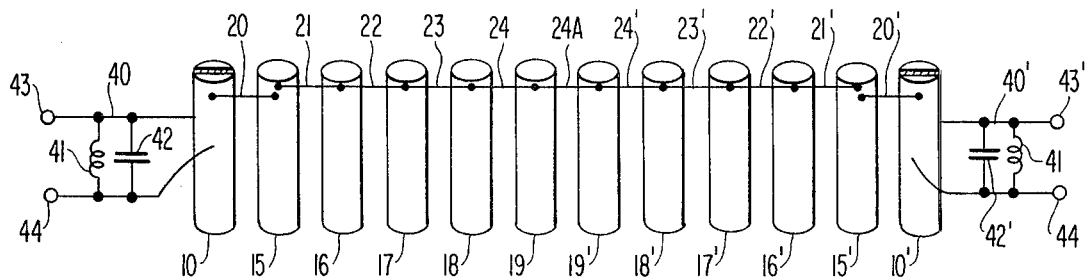
FIG. 1 is a schematic perspective view of an electromechanical filter to which the present invention is applicable.
Figure 2:
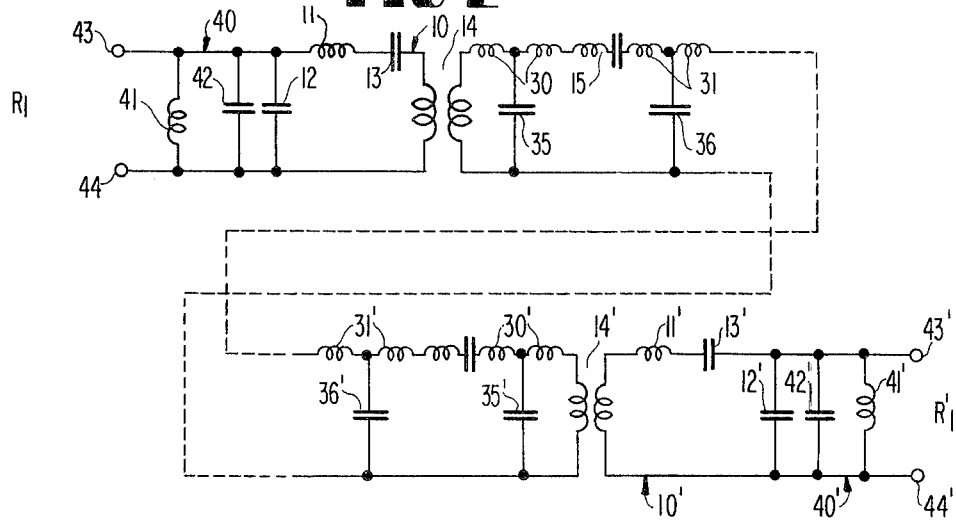
FIG. 2 illustrates an equivalent circuit of the filter depicted in FIG. 1.

Referring to FIGS. 1 and 2, an electromechanical filter to which this invention is applicable comprises an input transducer 10 for converting electric energy to mechanical energy and an output transducer 10' for converting mechanical energy to electric energy. Each of the transducers 10 and 10' comprises a piezoelectric ceramic piece, a pair of electrodes placed on opposing surfaces of the ceramic piece, and an elastically invariant alloy piece attached to one or each of the electrodes. The piezoelectric ceramic is preferably of the lead-zirconate-titanate class. The resonator is made of that known alloy of iron, nickel, chromium and titanium which has a substantially invariable modulus of elasticity. The input electromechanical transducer 10 has an equivalent inductance 11, an equivalent parallel capacitance 12, an equivalent series capacitance 13, and an equivalent transfer 14 of an electromechanical conversion coefficient or factor. Likewise, the output electromechanical transducer 10' is equivalent to a combination of an inductor 11', a parallel capacitor 12', a series capacitor 13', and a transformer 14'. In the example being illustrated, the filter further comprises intermediate mechanical resonators of a similar alloy 15, 16, 17, 18, 19, 19', 18', 17', 16' and 15'. Each intermediate resonator is equivalent to a series connection of an inductor and a capacitor. The resonators of the transducers 10 and 10' and other resonators 15-19 and 19'-15' are mechanically coupled together, as shown, by coupling rods 20, 21, 22, 23, 24, 24A, 24', 23', 22', 21' and 20' for the longitudinal mode of vibration. The coupling rods 20-24, 24A and 24'-20' are equivalent to center-tapped inductors 30, 31, 32, 33, 34, 34A, 34', 33', 32', 31' and 30' connecting the transformers and the series connections, and capacitors 35, 36, 37, 38, 39, 39A, 39', 38', 37', 36' and 35' connected to the center taps. Such an electromechanical filter per se is known as described in U.S. Pat. Nos. 3,842,294, 3,859,546 and 3,896,401.

Further referring to FIGS. 1 and 2, the electromechanical filter comprises known input and output external matching circuit 40 and 40' electrically connected to the respective transducers 10 and 10' (more exactly, to the ceramic piece electrodes). In the example being illustrated, the input matching circuit 40 comprises a parallel circuit of an inductor 41 and a capacitor 42. The output matching circuit 40' similarly comprises an inductor 41' and a capacitor 42'. The capacitors 42 and 42' are for temperature compensation as described in the preamble of the instance specification. The matching circuits 40 and 40' have a pair of input terminals 43 and 44 and a pair of output terminals 43' and 44' for connection to terminal impedances $R_1$ and $R_1'$. For simplicity of description, let it be assumed that the electromechanical filter is symmetric with respect to the center of the structure. Under the circumstances, the transducers 10 and 10' have a common transducer resonant frequency F. A resonance circuit formed of the inductor 41 or 41', the temperature-compensation capacitor 42 or 42', and the equivalent parallel capacitance 12 or 12' has a circuit resonant frequency $f_0$. The intermediae resonators 15 and 15', 16 and 16', 17 and 17', 18 and 18' and 19 and 19' have respective resonant frequencies $f_1$, $f_2$, $f_3$, $f_4$ and $f_5$.

In an electromechanical filter according to a first embodiment of this invention, the resonant frequencies $f_0$ through $f_5$ and F described hereinabove are selected as follows:

| | |
|---|---|
| $f_0$: 103.260 kHz, | $f_1$: 112.833 kHz, |
| $f_2$: 112.611 kHz, | $f_3$: 112.673 kHz, |
| $f_4$: 112.695 KHz, | $f_5$: 112.703 kHz, |
| F : 111.077 kHz; | | so that the filter has a passband center frequency $f_c$ of 113.813 kHz and a passband width of 3.2 kHz. As will become clear later, the inductor 41 has an inductance $L_1$ of $3.452 \times 10^{-3}$ henry while the equivalent inductance $L_2$ designated in FIG. 2 by 11 is 0.2536 henry. It is now understood that the circuit resonant frequency $f_0$ is rendered lower than the center frequency $f_c$ by about 11 kHz. Furthermore, the first-order temperature coefficients F' and $L_2'$ of the transducer resonant frequency F and the equivalent inductance $L_2$ are rendered equal to $-4.4492$ Hz/° C and $-3.1073 \times 10^{-3}$/° C in the numerical examples according to the first embodiment. It is possible to achieve the negative temperature coefficient by increasing the nickel content of the elastically invariant alloy. The transducer resonant frequency F is about 1.2 kHz lower than the lower end frequency of the passband. Although not necessary, this is preferable.

Figure 3:
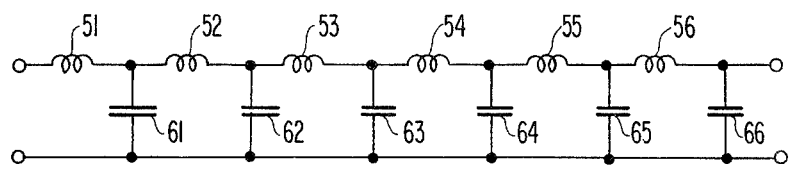
FIG. 3 is a circuit diagram of a normalized low-pass filter from which it is possible to derive in compliance with the teaching disclosed hereinafter the equivalent circuit shown in FIG. 2.
Figure 4:
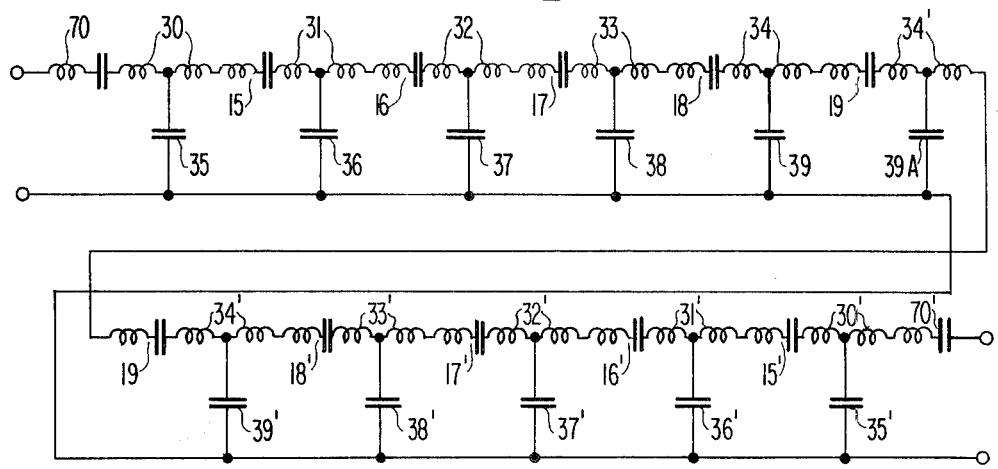
FIGS. 4 and 5 show an electric equivalent circuit of a mechanical filter and an equivalent circuit of an electromechanical system corresponding to the mechanical filter, respectively, both circuits being used during derivation of the equivalent circuit depicted in FIG. 2.
Figure 5:
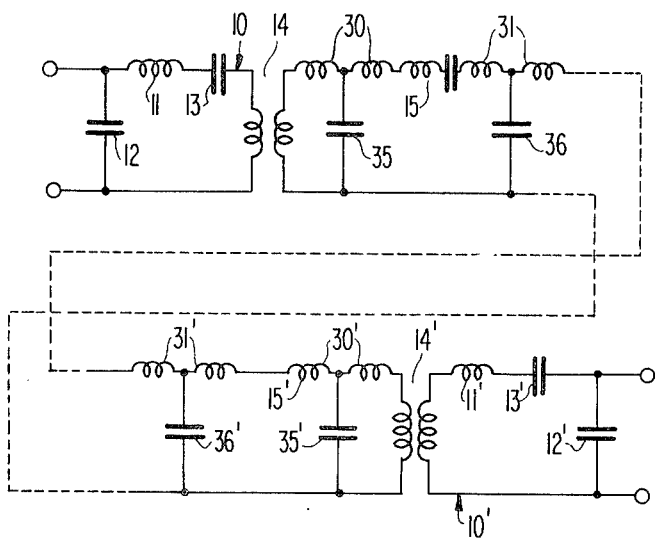

Referring now to FIGS. 3 through 5, the reasons will be described why an electromechanical filter having constants exemplified in the next preceding paragraph is operable in a wide temperature range. A normalized low-pass filter depicted in FIG. 3 comprises six series-connected inductors 51, 52, 53, 54, 55 and 56 and six capacitors 61, 62, 63, 64, 65 and 66 connected as shown. In order to derive the above-exemplified numerical values, let the constants of the circuit elements 51-56 and 61-66 be as follows when the input and output terminal impedances are 1 and 0.11725257 ohm, respectively:

| | |
|---|---|
| 51: 0.95986405 henry, | 52: 0.19477630 henry, |
| 53: 0.20591185 henry, | 54: 0.20718787 henry, |
| 55: 0.20261582 henry, | 56: 0.17315408 henry, |
| 61: 0.14767616 farad, | 62: 0.17280290 farad, |
| 63: 0.17670222 farad, | 64: 0.17561395 farad, |
| 65: 0.16611688 farad, | 66: 0.81862950 farad. |

More specifically referring to FIG. 4, a mechanical filter shown therein by the use of an electrical equivalent circuit is derived by transforming the above-exemplified low-pass filter into a band-pass filter of a passband center frequency $f_c$ of 113.813 kHz and a passband width of 3.2 kHz, both exemplified hereinabove, and by resorting to known techniques, such as the gyrator transformation. The mechanical filter comprises mechanical resonators 15-19 and 19'-15' and coupling rods 30-34, 34A, 34'-30', 35-39, 39A, and 39'-35' illustrated with reference to FIGS. 1 and 2. The filter further comprises input and output mechanical resonators 70 and 70'. The input and output terminal impedances have a common value of 7.6331873 kg/sec. Capacitances of the circuit elements 70, 15–19, 19'–15' and 70' are equal to 5.45006608 × 10⁻⁹ meter/Newton. Other capacitances in $10^{-7}$ meter/Newton and all inductances (L) in $10^{-6}$ kg are as follows:

| | | | |
|---|---|---|---|
| 35: | 2.27233051, | 36: | 3.23694022, |
| 37: | 3.50150699, | 38: | 3.60020817, |
| 39: | 3.64060119, | 39A: | 3.65186411, |
| 70 (L): | 350.194369, | 15 (L): | 344.153221, |
| 16 (L): | 347.174159, | 17 (L): | 347.783723, |
| 18 (L): | 347.997094, | 19 (L): | 348.073924, |
| 30: | 8.60563066, | 31: | 6.04114867, |
| 32: | 5.58469172, | 33: | 5.43158511, |
| 34: | 5.37132086, | 34A: | 5.35475486; | with the result that the resonators 70 and 15–19 have resonant frequencies F and $f_1$ through $f_5$ of the values already given hereinabove.

Turning to FIG. 5, an equivalent circuit of an electromechanical system corresponding to the mechanical filter illustrated in FIG. 4 is derived by modifying the input and output resonators 70 and 70' of the latter into the electromechanical transducers 10 and 10' by the use of the force-voltage analog taught by W. P. Mason in *Electronic-Mechanical Transducers and Wave Filters*, published in 1948 by D. van Nostrand Co. It will readily be understood that the equivalent circuit shown in FIG. 2 is obtained by adding the external matching circuits 40 and 40' to the circuit illustrated in FIG. 5.

In general, temperature-dependent changes $\Delta f$ and $\Delta R$ of the transducer resonant frequency F and the terminal impedance R are two important factors that govern the filter characteristics of an electromechanical filter. The former results from the temperature dependencies of the circuit constants of the transducer inductor 11 and capacitors 12 and 13 and of the matching circuit inductor 41 and capacitor 42. The latter comes from the temperature dependencies of the constants of the terminal impedance R and the transducer inductor 11. Let a criterion function $\Delta$ be defined by:

$$\Delta = |\Delta f| + k|\Delta R|, \quad (1)$$

where k is a constant for balancing the effects caused on the criterion function by the changes $\Delta f$ and $\Delta R$. In order to study by the use of Equation (1) the deviations introduced by a change in the temperature into the filter characteristics of an electromechanical filter depicted in FIG. 2 from the characteristics of an ideal standard filter, let the standard filter be given by the mechanical filter illustrated with reference to FIG. 4, wherein use is made of inductors and capacitors having temperature coefficients that cancel the temperature-dependent changes of their inductances and capacitances.

In the circuit shown in FIG. 2, let it be presumed that inductances $L_1(t)$ and $L_2(t)$ of the inductors 41 and 11 be given by:

$$L_1(t) = L_1[1 + L_1'(t-22)]$$

$$L_2(t) = L_2[1 + L_2'(t-22) + L_2''(t-22)^2],$$

where t represents the temperature in centigrade, $L_1$ and $L_2$ (already used without mention to a specific temperature) represent the inductances at room temperature (22° C, $L_1'$ and $L_2'$ represent the first-order temperature coefficients of the inductances, and $L_2''$ represents the second-order temperature coefficient of the inductance $L_2(t)$. Likewise, capacitances $C_1(t)$, $C_2(t)$ and $C_3(t)$ of the capacitors 42, 12 and 13 and the transducer resonant frequency F(t) are:

$$C_1(t) = C_1[1 + C_1'(t-22) + C_1''(t-22)^2]$$

$$C_2(t) = C_2[1 + C_2'(t-22) + C_2''(t-22)^2]$$

$$C_3(t) = C_3[1 + C_3'(t-22) + C_3''(t-22)^2]$$

$$F(t) = F - F'(t-22) - F''(t-22)^2,$$

where $C_1$, $C_2$, $C_3$ and F represent the respective values at room temperature, $C_1'$, $C_2'$, $C_3'$ and $F'$ represent the first-order temperature coefficients, and $C_1''$, $C_2''$, $C_3''$ and $F''$ represent the second-order temperature coefficients. Incidentally, the transducer resonant frequency is the resonant frequency of a series resonance circuit comprising the inductor 11 and the series capacitor 13. Now, the resonant frequency $f_X$ and the terminal impedance $R_X$ of a combination of the above-mentioned resonance circuit 41/42/12 and the transducer 10 or 10' are given by:

$$f_X = 1/[2\pi\sqrt{L_2(t) C_3(t) C_4(t)/(C_3(t) + C_4(t))}] \quad (2)$$

$$R_X = L_1(t)/R_1(t),$$

where $$C_4(t) = (1 + a^2) C_5(t)/a^2$$

$$C_5(t) = C_1(t) + C_2(t) - 1/[L_1(t) \cdot (2\pi f_0)^2]$$

$$R_1(t) = R_1/(1 + a^2)$$

and $$a = 2\pi f_0 R_1 C_5(t).$$

In FIG. 4, similar resonant frequency $f_Y$ and terminal impedance $R_Y$ do not vary with the temperature and are:

$$f_Y = f_r \quad (4)$$

$$R_Y = L_0/R_0, \quad (5)$$

where $f_r$ represents the resonant frequency of the series resonance circuit 70, $L_0$ represents the inductance of the inductor of this series resonance circuit, and $R_0$ represents the terminal impedance of the mechanical filter.

In Equation (1), the temperature-dependent changes $\Delta f$ and $\Delta R$ are thus given by the differences between the right-hand sides of Equations (2) and (4) and of Equations (3) and (5). Those parameters $L_1(t)$, $L_2(t)$, $C_1(t)$, and so on should now be determined which minimize the criterion function $\Delta$. The number of the parameters are, however, so large that it is nearly impossible to simultaneously determine the optimum parameters. The parameters are therefore divided into two groups. Parameters of a first group x are those readily realized and consist of $L_2$, $L_2'$, $L_2''$, $C_2$, $C_2'$ and $C_2''$ determined by the material of the piezoelectric ceramic pieces, of F' and F'' determined by the material of the transducer resonators, and of $L_1$ and $L_1'$ determined by the variation $\Delta L$ of the matching circuit inductance $L_1$ with temperature and by the inductance ratio $\gamma_L$, namely, $L_2/L_1$. Parameters of a second group y consist of F determined by the length of the transducer resonator and the remaining parameters $R_1$, $C_1$, $C_1'$ and $C_1''$. It is possible to determine the optimum values of the second-group parameters by the use of iterative approximation techniques described by Y. Ishisaki and H. Watanabe in *IEEE Transactions on Circuit Theory*, Vol. CT-15 (1968), No. 4, entitled "An Iterative Chebyshev Approximation Method for Network Design". The one-twentieth C.C.I.T.T. standard is satisfied with the criterion function $\Delta$ is equal to 100 or less.

When the variation $\Delta L$ and the inductance ratio $\gamma_L$ are made equal to 2% and 75, parameters of the first group $x$ are decided as follows:

| | |
|---|---|
| $L_1$: $4.482 \times 10^{-3}$ henry, | $L_1'$: $2.0 \times 10^{-4}/°$ C, |
| $L_2$: 0.2536 henry, | $L_2'$: $-3.1073 \times 10^{-3}/°$ C, |
| $L_2''$: $-5.9485 \times 10^{-6}/°$ C$^2$, | $C_2'$: $310 \times 10^{-12}$ farad, |
| $C_1'$: $2.9426 \times 10^{-3}/°$ C, | $C_1''$: $1.4736 \times 10^{-5}/°$ C$^2$, |
| F': $-4.4492$ Hz/° C, | F'': $-7.3968 \times 10^{-2}$ Hz/° C$^2$. |

With these first-group parameters and Equation (1) used, parameters of the second group $y$ are calculated as follows:

| | |
|---|---|
| F: 111.077 kHz, | $R_1$: 7.6 k$\Omega$, |
| $C_1$: $220 \times 10^{-12}$ farad, | $C_1'$: $-2.087 \times 10^{-4}/°$ C, |
| $C_1''$: $1.557 \times 10^{-5}/°$ C$^2$. | |

The circuit resonant frequency $f_0$ results from the constants given above for the inductor 41 and capacitors 42 and 12 and is 103.260 kHz. It is now understood that these parameters of the first and second groups $x$ and $y$ render the temperature dependencies of the transducer resonant frequency and the transducer equivalent inductance minimum and that an electromechanical filter having the circuit constants or parameters given in conjunction with the first embodiment satisfies the one-twentieth C.C.I.T.T. standard in a wide temperature range.

Figure 6:
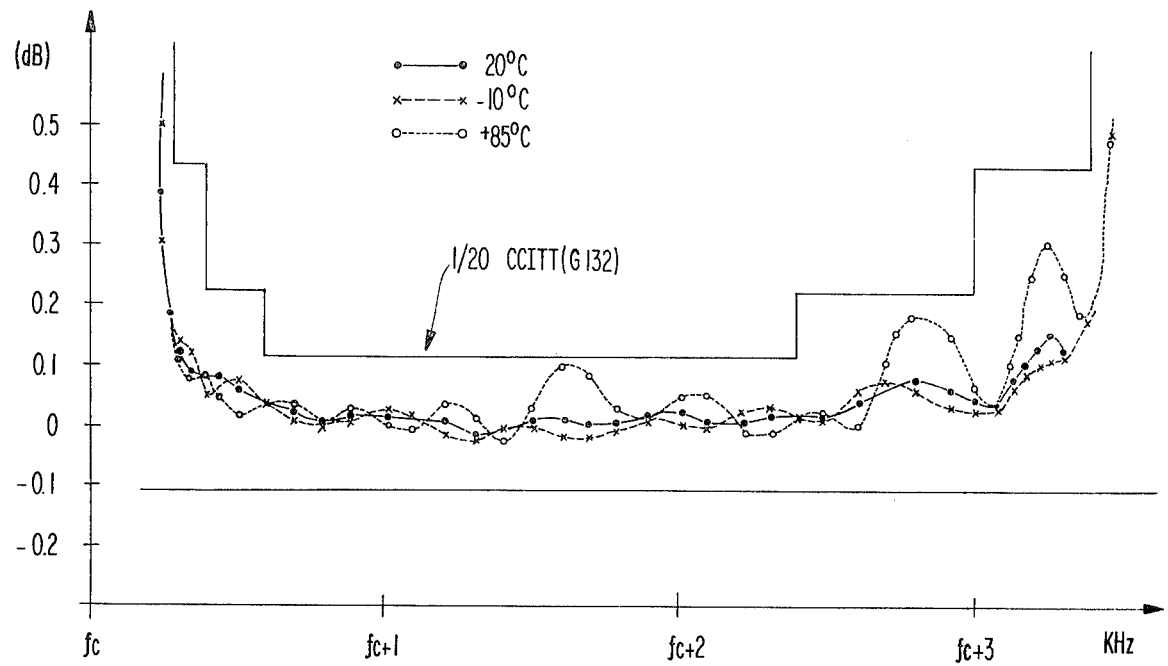
FIG. 6 shows filter characteristics of an electromechanical filter according to an embodiment of this invention with temperatures used as parameters and with a range defined by the one-twentieth C.C.I.T.T. standard also depicted.

Referring finally to FIG. 6, an electromechanical filter having the above-exemplified circuit parameters was tested at various temperatures. It is clear from comparison with the one-twentieth C.C.I.T.T. standard also depicted therein that the filter satisfies the standard in a temperature range between $-10°$ C and 85° C.

According to a second embodiment of this invention, an electromechanical filter of the symmetrical structure illustrated with reference to FIGS. 1 and 2 has circuit parameters exemplified in the following:

| | |
|---|---|
| $L_1$: $2.241 \times 10^{-3}$ henry, | $L_1'$: $2.0 \times 10^{-4}/°$ C, |
| $L_2$: 0.2536 henry, | $L_2'$: $-3.1073 \times 10^{-3}/°$ C, |
| $L_2''$: $-5.9485 \times 10^{-6}/°$ C$^2$, | $C_1$: $406.1 \times 10^{-12}$ farad, |
| $C_1'$: $-4.1064 \times 10^{-3}/°$ C, | $C_1''$: $-3.874 \times 10^{-5}/°$ C$^2$, |
| $C_2$: $310 \times 10^{-12}$ farad, | $C_2'$: $2.9426 \times 10^{-3}/°$ C, |
| $C_2''$: $1.4736 \times 10^{-5}/°$ C$^2$, | F: 114.353 kHz, |
| F': 4.4492 Hz/° C, | F'': $7.3968 \times 10^{-2}$ Hz/° C$^2$, |
| $f_0$: 125.636 kHz, | $R_1$: 7.6 k$\Omega$. |

These parameters are derived by setting the variation $\Delta L$ of the matching circuit inductance $L_1$ and the inductance ratio $\gamma_L$ at 1.4% and 110, respectively. The circuit resonant frequency $f_0$ is higher than the passband center frequency $f_c$, which is 113.813 kHz as in the numerical example for the first embodiment. The first-order temperature coefficients F' and $L_2'$ of the transducer resonant frequency and equivalent inductance F and $L_2$ are positive and negative, respectively. The positive temperature coefficient of the transducer resonant frequency is achieved by decreasing the nickel content of the elastically invariant alloy. Although not described in conjunction with the first embodiment, it is preferred to make the elastically invariant alloy piece of each transducer 10 or 10' have a mechanical resonant frequency of a positive first-order temperature coefficient.

When the external circuit 40 or 40' depicted in FIGS. 1 and 2 comprises a series connection of the inductor 41 and capacitor 42, the resonant frequency $f_X$ and the terminal impedance $R_X$ are given, instead of by Equations (2) and (3), by:

$$f_X = 1/[2\pi \sqrt{L_2(t) C_3(t) C_6(t)/(C_3(t) + C_6(t))}]$$

$$R_X = L_1(t)/R_2(t),$$

where $$C_6(t) = [R_0^2 + (X_1 + X_2)^2]/[2\pi f_0(R_0^2 X_2 + X_1 X_2 [X_1 + X_2])]$$

$$R_2(t) = [R_0 X_2 (X_1 + X_2) - R_0 X_1 X_2]/[R_0^2 + (X_1 + X_2)^2]$$

$$X_1 = 2\pi f_0 L_1(t) - 1/[2\pi f_0 C_1(t)]$$

$$X_2 = -1/[2\pi f_0 C_2(t)].$$

When the inductor 41 is connected in parallel while the capacitor 42 is connected in series between the inductor 41 and the associated transducer 10, the resonant frequency $f_X$ and the terminal impedance $R_X$ are given by:

$$f_X = 1/[2\pi \sqrt{L_2(t) C_3(t) C_7(t)/(C_3(t) + C_7(t))}]$$

$$R_X = L_1(t)/R_3(t),$$

where $$C_7(t) = [Y_1^2 (Y_2 + Y_3)^2 + R_0^2 (Y_1 + Y_2 + Y_3)^2] \div [2\pi f_0 (Y_1^2 Y_2 Y_3 [Y_1 + Y_3] + R_0 [Y_1 + Y_2 + Y_3] [Y_1 Y_3 + Y_2 Y_3])]$$

$$R_3(t) = [R_0 Y_1 Y_3 (Y_1 + Y_2)(Y_2 + Y_3) + R_0 Y_1 Y_2 Y_3 (Y_1 + Y_2 + Y_3)] \div [Y_1^2 (Y_2 + Y_3)^2 + R_0^2 (Y_1 + Y_2 + Y_3)^2]$$

$$Y_1 = 2\pi f_0 L_1(t)$$

$$Y_2 = -1/[2\pi f_0 C_1(t)]$$

$$Y_3 = -1/[2\pi f_0 C_2(t)].$$

When the inductor 41 is connected in parallel with the capacitor 42 but between the terminal 43 or 43' and the corresponding end of the inductor 41, the resonant frequency $f_X$ and the terminal impedance $R_X$ are given by:

$$f_X = 1/[2\pi \sqrt{L_2(t) C_3(t) C_8(t)/(C_3(t) + C_8(t))}]$$

$$R_X = L_1(t)/R_4(t),$$

where $$C_8(t) = [Z_1^2 (Z_2 + Z_3)^2 + R_0^2 (Z_1 + Z_2 + Z_3)^2] \div [2\pi f_0 (Z_1^2 Z_2 Z_3 [Z_1 + Z_3] + R_0 [Z_1 + Z_2 + Z_3] [Z_1 Z_3 + Z_2 Z_3])]$$

$$R_4(t) = [R_0 Z_1 Z_3 (Z_1 + Z_2)(Z_2 + Z_3) - R_0 Z_1 Z_2 Z_3 (Z_1 + Z_2 + Z_3)] \div [Z_1^2 (Z_2 + Z_3)^2 + R_0^2 (Z_1 + Z_2 + Z_3)^2]$$

$$Z_1 = -1/[2\pi f_0 C_1(t)]$$

$$Z_2 = 2\pi f_0 L_1(t)$$

$Z_3 = 1/[2\pi f_0 C_2(t)]$.

We claim:

1. In an electromechanical filter comprising a mechanical resonator, an input transducer for converting electric energy to mechanical energy, an output transducer for converting mechanical energy to electric energy, and a pair of external matching circuits electrically connected to the respective transducers, said transducers being mechanically coupled to each other with said resonator interposed, said filter having a predetermined passband including a center frequency, each of said transducers having an equivalent inductance, an equivalent parallel capacitance, and an equivalent series capacitance, each of said matching circuits comprising a coil and a temperature-compensation capacitor connected to form a resonance circuit together with the parallel capacitance of the electrically connected transducer, the improvement wherein the circuit resonant frequencies of each resonance circuit are selected to lie outside of said predetermined passband.

2. An electromechanical filter as claimed in claim 1, wherein said circuit resonant frequencies are made lower than said passband.

3. An electromechanical filter as claimed in claim 2, wherein first-order temperature coefficients of transducer resonant frequencies and of the equivalent inductances are rendered negative, each of said transducer resonant frequencies being the resonant frequency of a series resonance circuit comprising said equivalent inductance and said series capacitance.

4. An electromechanical filter as claimed in claim 3, wherein said transducer resonant frequencies are made lower than said passband.

5. An electromechanical filter as claimed in claim 4, wherein each of said transducers comprises an elastically invariant alloy piece with a mechanical resonant frequency having a negative first-order temperature coefficient.

6. An electromechanical filter as claimed in claim 1, wherein said circuit resonant frequencies are made higher than said passband.

7. An electromechanical filter as claimed in claim 6, wherein first-order temperature coefficients of transducer resonant frequencies and of the equivalent inductances are rendered positive and negative, respectively, each of said transducer resonant frequencies being the resonant frequency of a series resonance circuit comprising said equivalent inductance and said series capacitance.

8. An electromechanical filter as claimed in claim 7, wherein each of said transducers comprises an elastically invariant alloy piece with a mechanical resonant frequency having a positive first-order temperature coefficient.

* * * * *

UNITED STATES PATENT AND TRADEMARK OFFICE
CERTIFICATE OF CORRECTION

PATENT NO. : 4,091,345
DATED : May 23, 1978
INVENTOR(S) : Takeshi YANO et al

It is certified that error appears in the above-identified patent and that said Letters Patent are hereby corrected as shown below:

IN THE SPECIFICATION:

Column 1, line 53 - delete "Ronbunsyu" insert -- Ronbunsyû --

Column 3, line 30 - delete "transfer" insert -- transformer --

Column 4, line 15 - delete "KHz" insert -- kHz --

Column 6, line 9 - delete "$F(t) = F - F(t-22) - F'(t-22)^2,$" insert -- $F(t) = F - F'(t-22) - F''(t-22)^2,$ -- line 12 - delete "F" insert -- F' -- line 14 - delete "F'" insert -- F" -- line 25 - after equation insert -- (3) --

Signed and Sealed this

Twenty-eighth Day of November 1978

[SEAL]

Attest:

RUTH C. MASON
Attesting Officer

DONALD W. BANNER
Commissioner of Patents and Trademarks